United States Patent [19]

Aoyama et al.

[11] Patent Number: 4,587,639
[45] Date of Patent: May 6, 1986

[54] STATIC SEMICONDUCTOR MEMORY DEVICE INCORPORATING REDUNDANCY MEMORY CELLS

[75] Inventors: Keizo Aoyama, Yamato; Teruo Seki; Takahiko Yamauchi, both of Kawasaki, all of Japan

[73] Assignee: Fujitsu Limited, Kanagawa, Japan

[21] Appl. No.: 593,771

[22] Filed: Mar. 27, 1984

[30] Foreign Application Priority Data

Mar. 28, 1983 [JP] Japan ................................. 58-50347
Mar. 29, 1983 [JP] Japan ................................. 58-51535

[51] Int. Cl.⁴ .............................................. G11C 7/00
[52] U.S. Cl. ...................................... 365/200; 365/190
[58] Field of Search ............... 365/200, 201, 190, 230, 365/96, 226, 227; 371/10, 21

[56] References Cited

U.S. PATENT DOCUMENTS 4,228,528  10/1980  Cenker et al. ...................... 365/200
4,281,398   7/1981  McKenny et al. .................. 365/200

Primary Examiner—Joseph A. Popek
Attorney, Agent, or Firm—Armstrong, Nikaido, Marmelstein & Kubovcik

[57] ABSTRACT

In a static semiconductor memory device incorporating redundancy memory cells ($C_{R0}$, $C_{R1}$, ...), a connecting/disconnecting circuit is linked between a power supply terminal ($V_{CC}$) and one of bit lines ($B_0$, $\overline{B}_0$, ...), thereby reducing or cutting off a current flowing through a defective memory cell.

13 Claims, 29 Drawing Figures

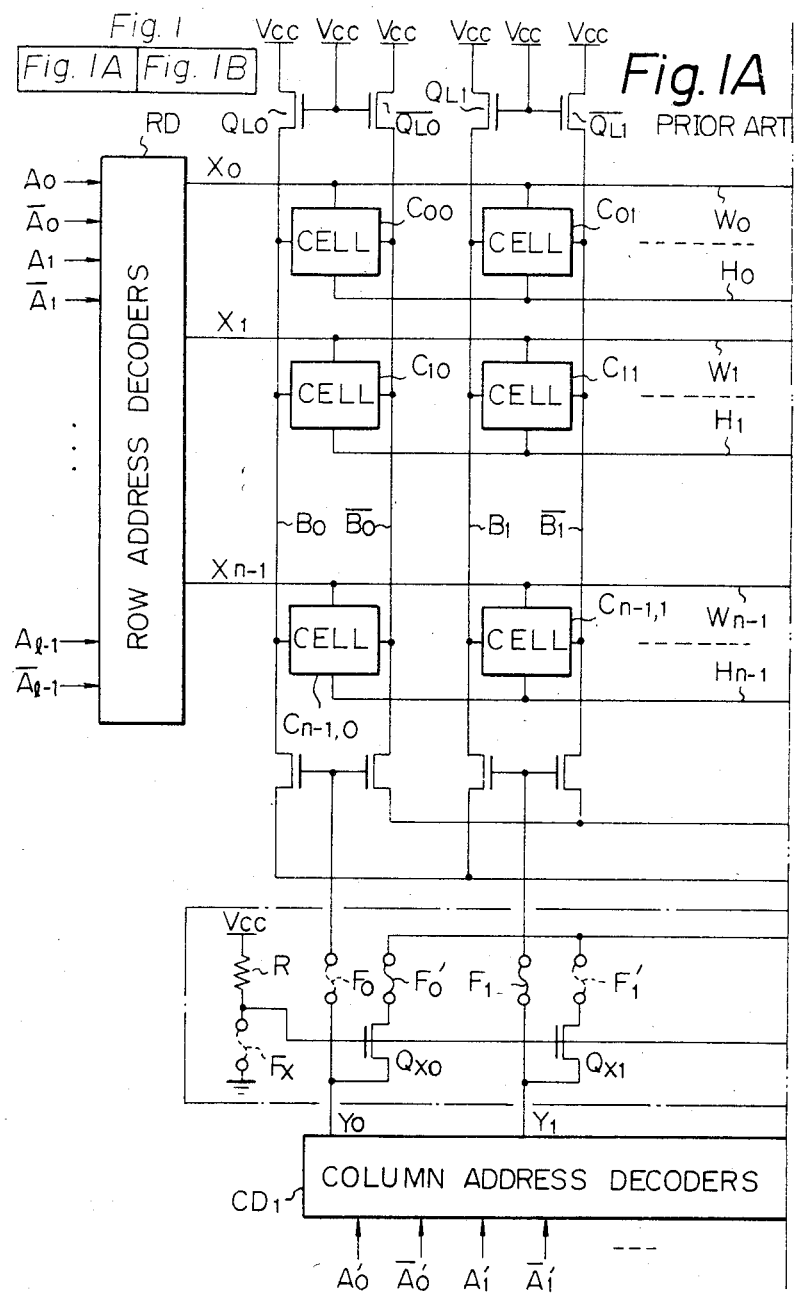

Fig. 2
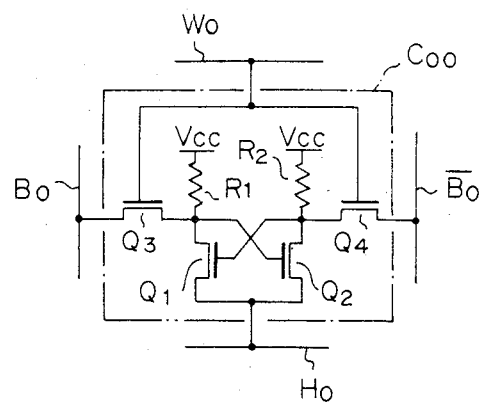
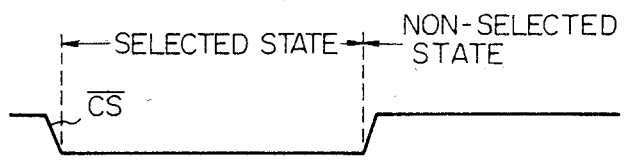
Fig. 4A
Fig. 4B

| Fig. 3A | Fig. 3B |

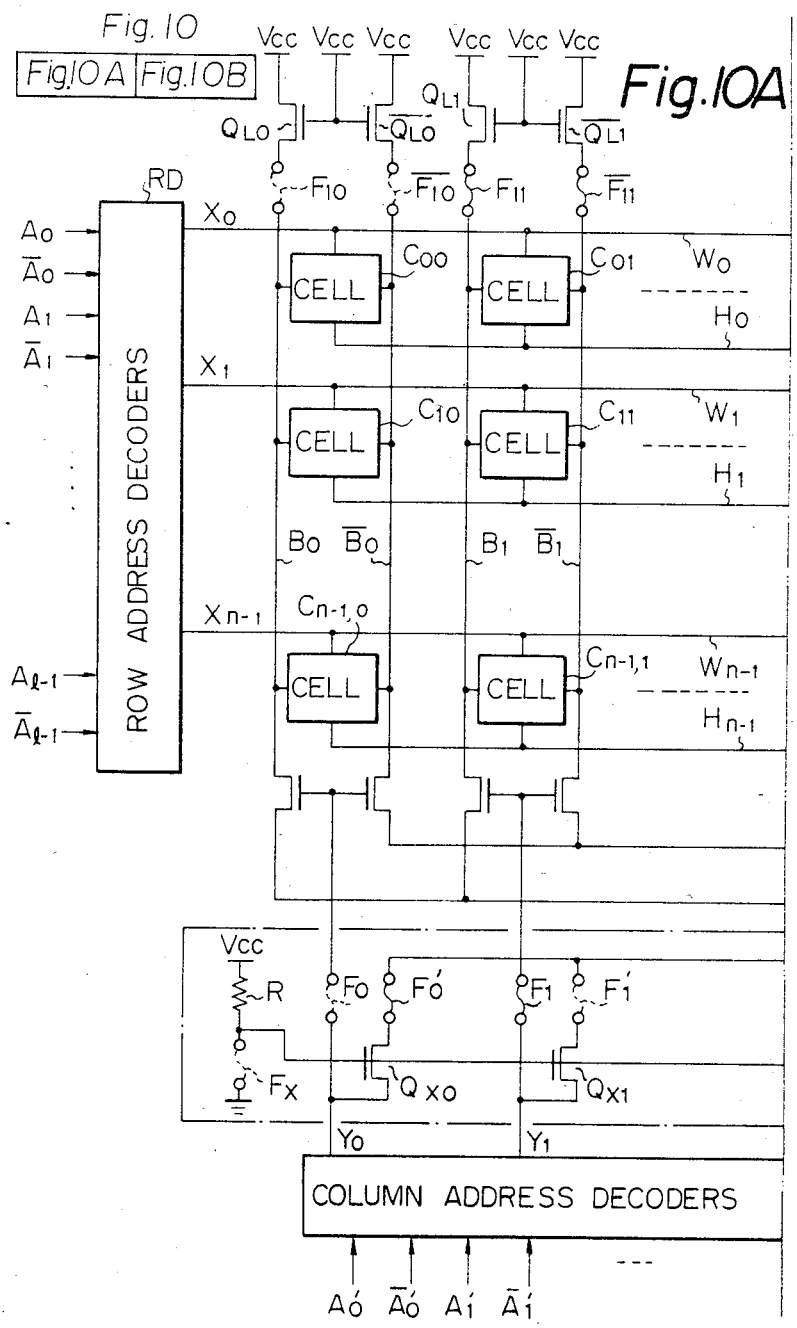

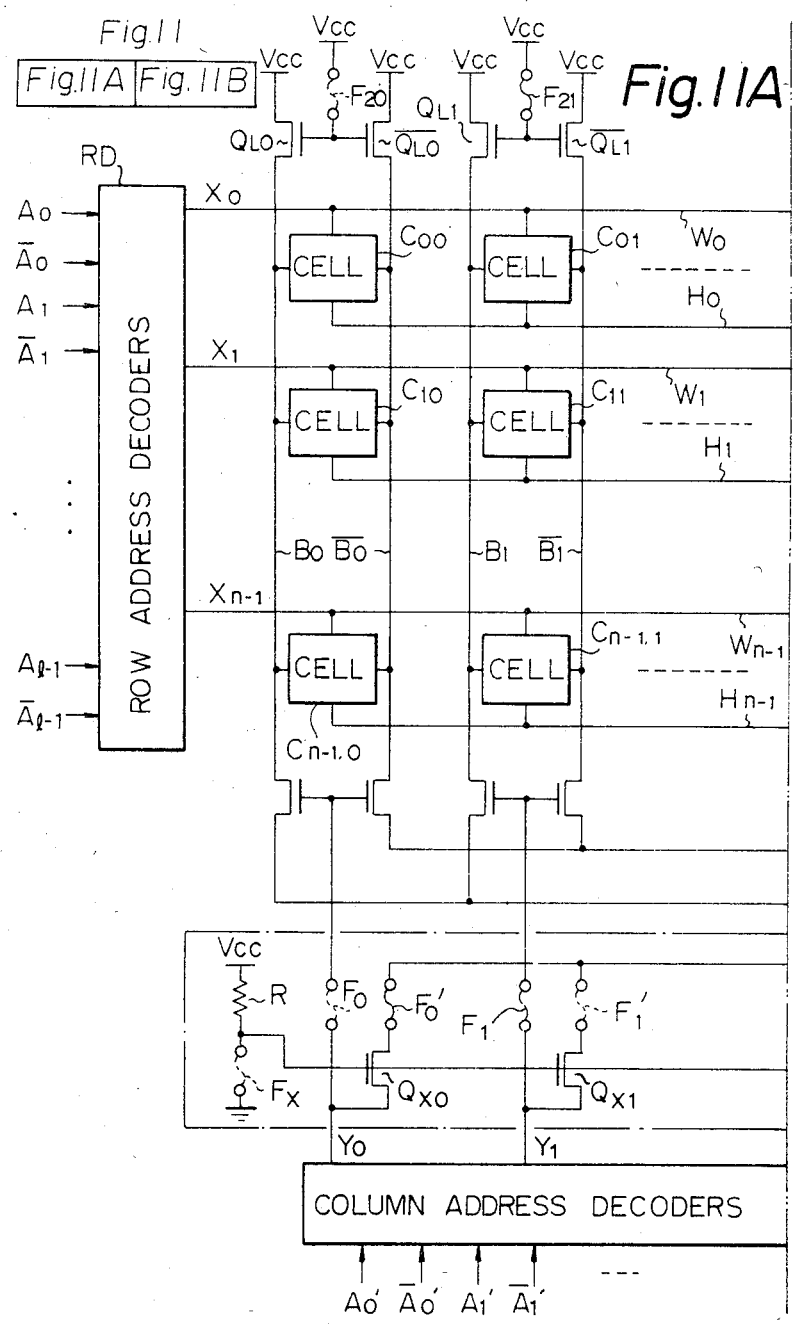

STATIC SEMICONDUCTOR MEMORY DEVICE INCORPORATING REDUNDANCY MEMORY CELLS

BACKGROUND OF THE INVENTION

1. Field of the Invention

The present invention relates to a static semiconductor memory device incorporating redundancy memory cells.

In a semiconductor memory device, a large number of memory cells are arranged along rows and columns. The density of defects generated in such a semiconductor memory device during the manufacture thereof is relatively independent of the integration density of the device. Rather, it derives from the semiconductor manufacturing technology. In general, the higher the integration density of the device, the greater the ratio of normal memory cells to defective memory cells. This is one of the advantages of increasing the integration density of a semiconductor memory device.

Even if a device includes only one defective memory cell, however, the device cannot be operated normally and, therefore, must be scrapped. As a result, despite the lower ratio of defective memory cells, greater integration density means reduced manufacturing yield.

To overcome the problem of defective memory cells, use is made of redundancy memory cells. When a defective memory cell is detected, a redundancy memory cell row or column is selected instead of the memory cell row or column including the defective memory cell. In general, one or two redundancy memory cell rows or columns are usually provided.

A problem in the prior art, however, has been that when the defective memory cell has a direct current (DC) defect, i.e., when the defective memory cell is short-circuited, the DC defect itself is not resolved even when a redundancy memory cell row or column is selected.

SUMMARY OF THE INVENTION

It is an object of the present invention to provide a static semiconductor memory device incorporating redundancy memory cells in which DC defects themselves are substantially resolved.

According to the present invention, the potential of a clock signal is applied to loads linked between bit line pairs and a power supply at least during a non-selected state (stand-by state) so as to cut off currents flowing through the loads, thereby reducing the load currents of bit lines for all memory cells, including a defective memory cell. That is, even when the defective memory cell has a DC defect, power supply currents due to the DC defect are suppressed, thereby substantially resolving the DC defect.

According to another aspect of the present invention, fuses are provided between the bit line pairs and the power supply. When a defective memory cell is detected, fuses corresponding to this defective memory cell are melted so as to cut off currents flowing to the defective memory cell, thereby completely resolving the DC defect.

BRIEF DESCRIPTION OF THE DRAWINGS

The present invention will be more clearly understood from the description as set forth below with reference to the accompanying drawings, wherein:

FIGS. 1A and 1B aligned as shown in FIG. 1 is a block diagram of a prior art static semiconductor memory device;

FIG. 2 is a circuit diagram of the memory cell of FIG. 1;

FIGS. 4A and 4B are timing diagrams for explaining the clock signal $\phi$ in FIG. 3;

FIGS. 10A and 10B and FIGS. 11A and 11B aligned as shown in FIGS. 10 and 11, respectively, are block diagrams of second and third embodiments of the semiconductor memory device according to the present invention.

DESCRIPTION OF THE PREFERRED EMBODIMENTS

Figure 1B:
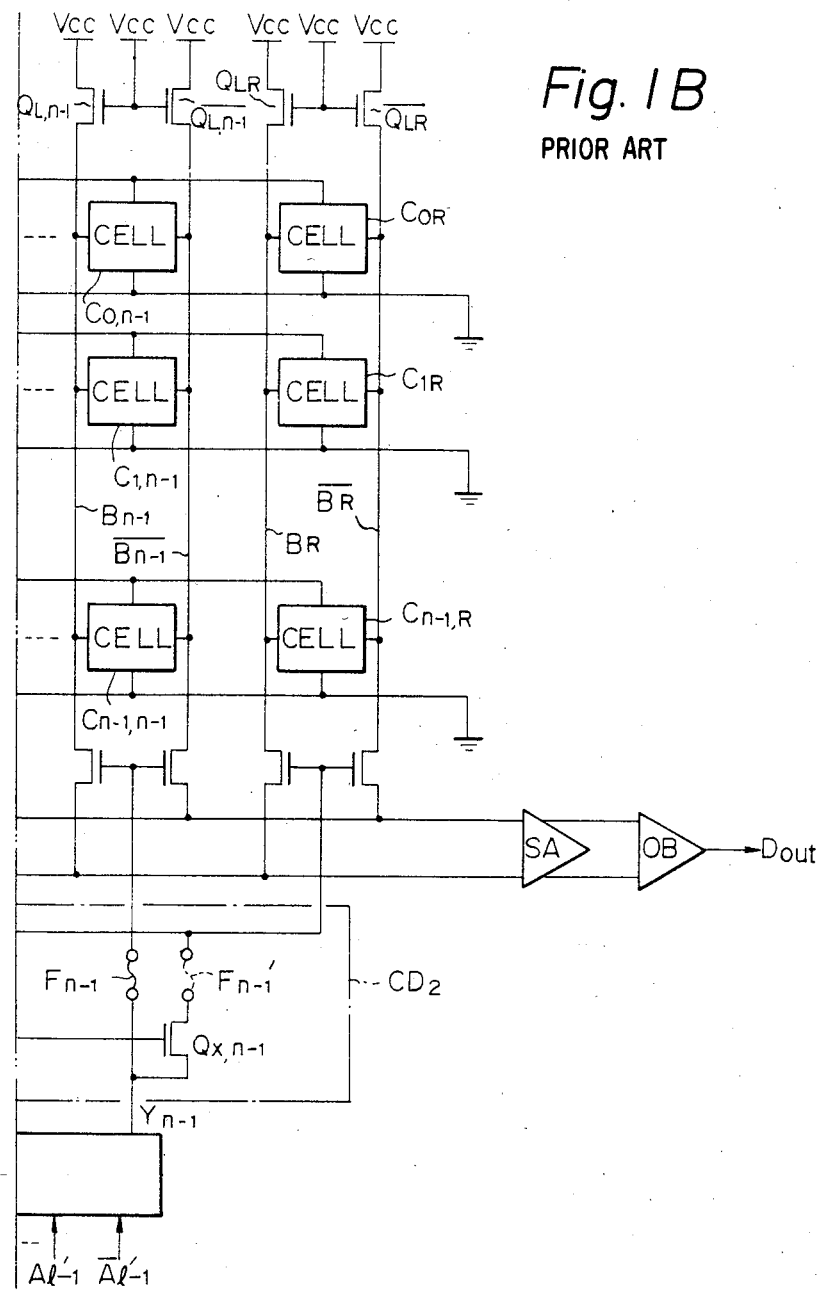

In FIGS. 1A and 1B, which together illustrate a prior art static semiconductor memory device, normal static memory cells $C_{ij}$ (i,j=0, 1, ..., n−1) are arranged in an n-row n-column matrix. Each memory cell is connected to one word line, a hold line and a pair of bit lines. For example, a memory cell $C_{00}$ is connected to a word line $W_0$, to a hold line $H_0$, and to bit lines $B_0$ and $\overline{B}_0$. In addition, a series of memory cells $C_{0R}$, $C_{1R}$, ..., $C_{n-1,R}$ are arranged along the column direction. These memory cells $C_{0R}$, $C_{1R}$, ..., $C_{n-1,R}$ serve as redundancy memory cells.

Selection of the word lines $W_0$, $W_1$, ..., $W_{n-1}$ is performed by the row-selection signals $X_0$, $X_1$, ..., $X_{n-1}$ of row address decoders RD. That is, the row address decoders RD receive address signals $A_0$, $\overline{A}_0$, $A_1$, $\overline{A}_1$, ... $A_{l-1}$, $\overline{A}_{l-1}$ from row address buffers (not shown). Accordingly, one of the outputs $X_0$, $X_1$, ..., $X_{n-1}$ ($n=2^l$) of the decoders RD becomes high, whereby one of the word lines is selected. On the other hand, the hold lines $H_0$, $H_1$, ..., $H_{n-1}$ are connected to the earth, which serves as one of the power supplies. The bit lines $B_0$, $\overline{B}_0$, $B_1$, $\overline{B}_1$, ..., $B_{n-1}$, $\overline{B}_{n-1}$, $B_R$, and $\overline{B}_R$ are connected via load transistors $Q_{L0}$, $\overline{Q}_{L0}$, $Q_{L1}$, $\overline{Q}_{L1}$, ..., $Q_{LR}$, $\overline{Q}_{LR}$ to a power supply $V_{CC}$. The load transistors are, for example, enhancement metal-insulator-semiconductor (MIS) transistors.

Reference $CD_1$ designates column decoders, and $CD_2$ designates a decoder for selecting the redundancy memory cells. The decoder $CD_2$ is comprised of a resistor R, fuses $F_X$, $F_0$, $\overline{F}_0$, $F_1$, $\overline{F}_1$, ..., $F_{n-1}$, $\overline{F}_{n-1}$, and transistors $Q_{X0}$, $Q_{X1}$, ..., $Q_{Xn-1}$. Note, SA is a sense amplifier, OB is an output buffer, $D_{out}$ is output data, and $A_0'$, $\overline{A}_0'$, $A_1'$, $\overline{A}_1'$, ..., $A_{l-1}'$, and $\overline{A}_{l-1}'$ are column address signals.

Prior to the test of the device of FIG. 1, all the fuses of the decoder $CD_2$ are in a connected state. Therefore, the gate potentials of the transistors $Q_{X0}$, $Q_{X1}$, ..., $Q_{X,n-1}$ are low, and accordingly, these transistors are in an off state. In this state, a test is performed upon the memory cells $C_{ij}$ (i,j=0, 1, ..., n−1). If the memory cell $C_{00}$ is determined to be defective, the fuse $F_X$ is melted so as to turn on the transistors $Q_{X0}, Q_{X1}, \ldots Q_{Xn-1}$. In addition, the fuses $F_0, F_1', \ldots, F_{n-1}'$ are melted. Thus, when the column decoders $CD_1$ generate a column selection signal $Y_0$ for selecting the memory cell $C_{00}$, the redundancy memory cell $C_{0R}$ instead of the defective memory cell $C_{00}$ is actually selected by the fuse $F_0'$. Note, if no defective memory cell is detected, none of the fuses are melted, and, accordingly, all the fuses are in a connected state. Thus, it is possible to detect a redundancy memory cell instead of a defective memory cell.

In the device of FIGS. 1A and 1B, however, when a direct current (DC) defect is generated in the interior of a memory cell, the defect itself is not resolved. For example, as illustrated in FIG. 2, the memory cell $C_{00}$ is comprised of resistors $R_1$ and $R_2$, driver transistors $Q_1$ and $Q_2$, and transfer transistors $Q_3$ and $Q_4$. Therefore, when a DC defect is generated so as to short-circuit the bit line $B_0$ or $\overline{B}_0$ to the hold line $H_0$, a current flows from the power supply $V_{CC}$ via the load transistor $Q_L$ and the short-circuited portion to the hold line $H_0$ even when the redundancy memory cell $C_{0R}$ is selected instead of the memory cell $C_{00}$. Therefore, the DC defect itself is not resolved.

In FIG. 1, note, the power supply voltage $V_{CC}$ is also applied to the gates of the load transistors $Q_{L0}, \overline{Q}_{L0}, Q_{L1}, \overline{Q}_{L1}, \ldots, Q_{L,n-1}, \overline{Q}_{L,n-1}, Q_{LR}, \overline{Q}_{LR}$.

Figures 3, 3A:
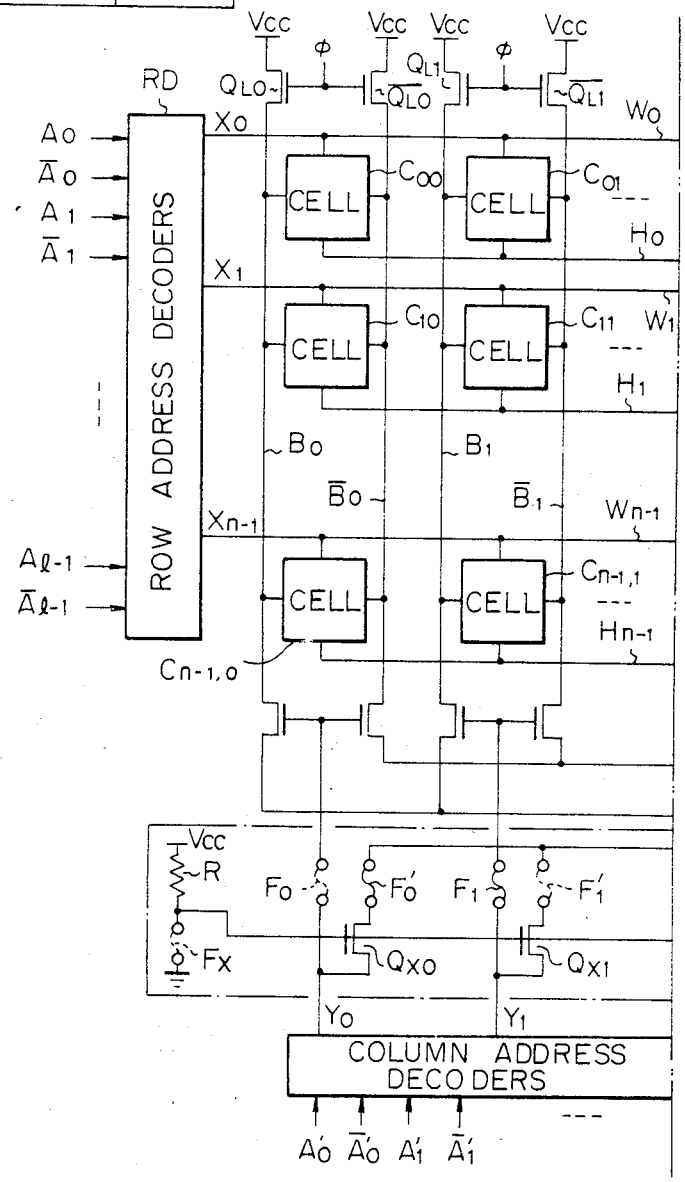
FIGS. 3A and 3B aligned as shown in FIG. 3 is a block diagram of a first embodiment of the static semiconductor memory device according to the present invention.
Figure 3B:
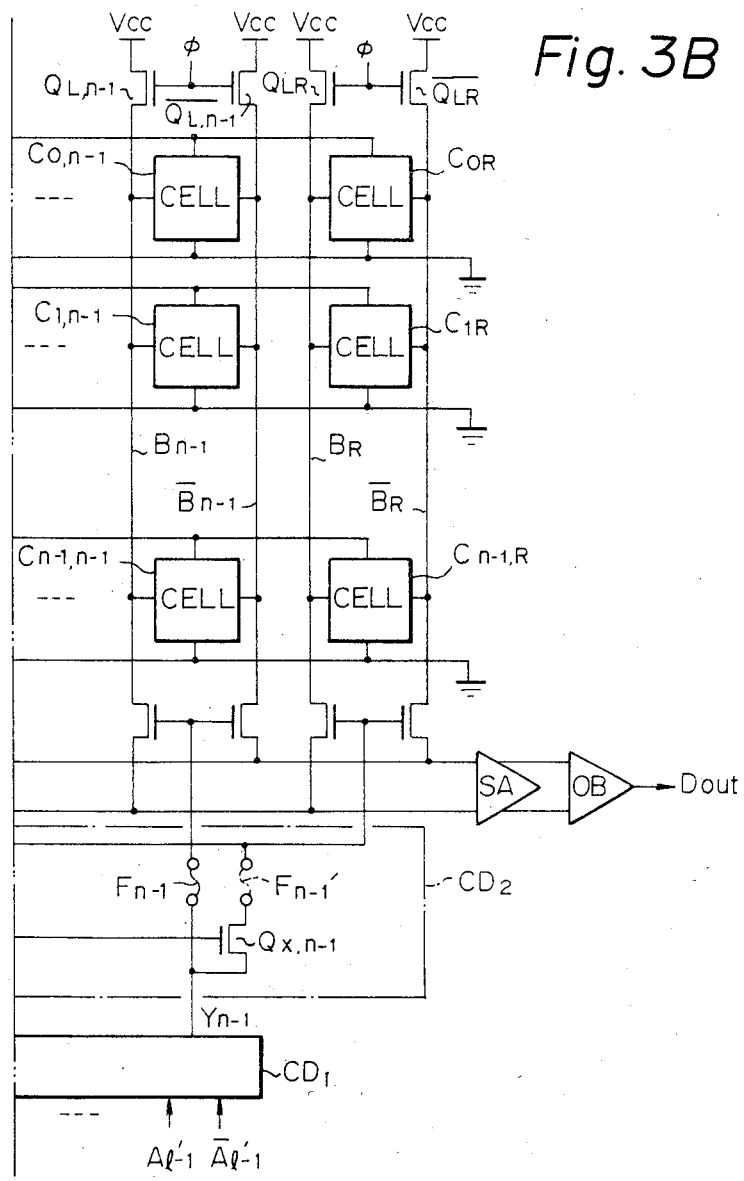

In FIGS. 3A and 3B, which together illustrate a first embodiment of the static semiconductor memory device according to the present invention, a clock signal $\phi$ is applied to the gates of the transistors $Q_{L0}, \overline{Q}_{L0}, Q_{L1}, \overline{Q}_{L1}, \ldots, Q_{L,n-1}, \overline{Q}_{L,n-1}, Q_{LR}, \overline{Q}_{LR}$. The potential of the clock signal $\phi$ is made low at least during a non-selected state, thereby preventing currents from flowing from the power supply $V_{CC}$ to all the memory cells.

Figure 5:
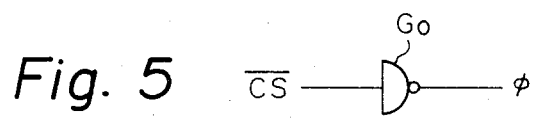
FIG. 5 is a logic diagram of a circuit for generating the clock signal $\phi$ of FIG. 4B.

As shown in FIGS. 4A and 4B, the above-mentioned clock signal $\phi$ is obtained as an inversion signal of a chip select signal $\overline{CS}$. That is, the clock signal $\phi$ is easily obtained by using an inverter $G_0$ as shown in FIG. 5. As a result, even when the above-mentioned DC defect is generated, no short-circuit current due to the DC defect flows during a non-selected state, since the potential of the clock signal $\phi$ is, in this case, low, so that all the load transistors are cut off. Note, a current flowing through the defective portion in the case of the potential of the clock signal $\phi$ being high is extremely small as compared with the total power consumption of the semiconductor device. Accordingly, no problem occurs.

Figure 6A:
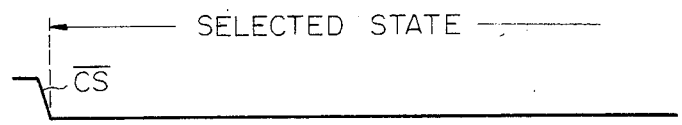
FIGS. 6A, 6B, and 6C are other timing diagrams for explaining the clock signal $\phi$ in FIG. 3.
Figure 6B:
Figure 6C:

FIGS. 6A, 6B, and 6C are also timing diagrams for explaining the generation of the clock signal $\phi$ of FIG. 3. The clock signal $\phi$ as shown in FIG. 6C becomes high for a definite time period only after the chip select signal $\overline{CS}$ as shown in FIG. 6A is changed or after one ADD of the row address signals $A_0, A_1, \ldots,$ and $A_{l-1}$ is changed. Therefore, the current flowing from the power supply $V_{CC}$ to the above-mentioned defective portion is smaller as compared with the clock signal $\phi$ as shown in FIG. 4B. Note, the reason why power supply currents due to the conductive load transistors are supplied to the bit lines after the change of the row address signals $A_0, A_1, \ldots,$ and $A_{l-1}$ is that, when reverse data opposed to the previous read data is read out from the same bit line pair, the bit line pair must be in a precharging (stand-by) state.

Figure 7:
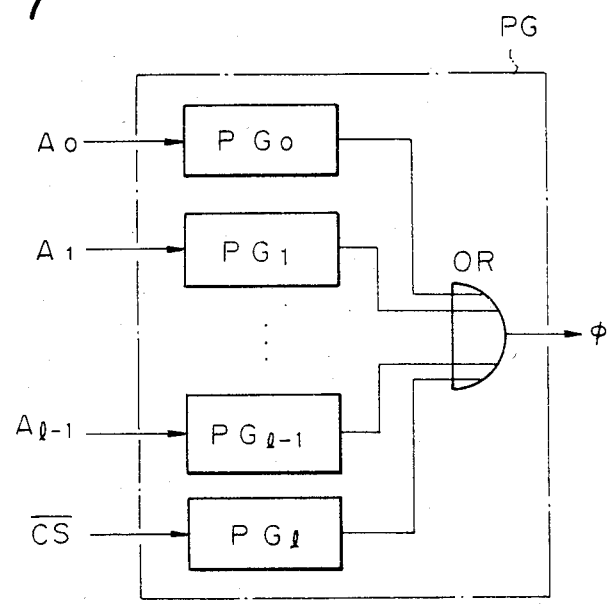
FIG. 7 is a block circuit diagram of a circuit for generating the clock signal $\phi$ in FIG. 6C.

The clock signal $\phi$ as shown in FIG. 6C can be obtained by a pulse generating circuit PG of FIG. 7. That is, in FIG. 7, the pulse generating circuit PG comprises a plurality of clock pulse generating circuits $PG_0, PG_1, \ldots, PG_{l-1}$, and $PG_l$ corresponding to each of the row address signals $A_0, A_1, \ldots, A_{l-1}$, and the chip select signal $\overline{CS}$. Therefore, when one of the signals $A_0, A_1, \ldots, A_{l-1}$, and $\overline{CS}$ is changed, for example, when the signal $A_0$ is changed, the clock pulse generating circuit $PG_0$ generates the clock signal $\phi$ via an OR circuit OR. That is, when the device of FIG. 3 is changed from a non-selected state to a selected state or vice versa, or when the selected row is changed, the pulse generating circuit PG generates the clock signal $\phi$.

Figure 8:
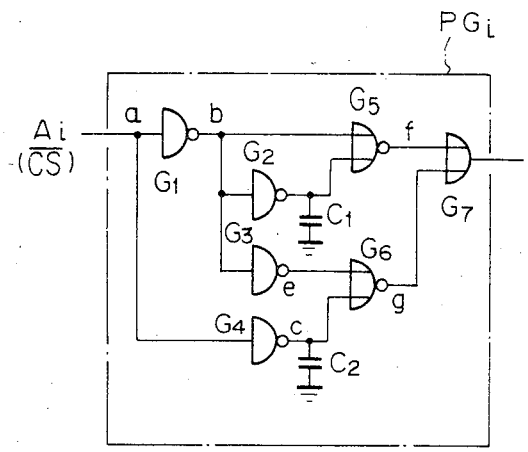
FIG. 8 is a logic circuit diagram of the pulse generating circuit $PG_i$ of FIG. 7.
Figure 9A:
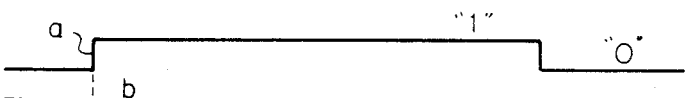
FIGS. 9A through 9H are timing diagrams of the signals appearing in the circuit of FIG. 8.
Figure 9B:
Figure 9C:
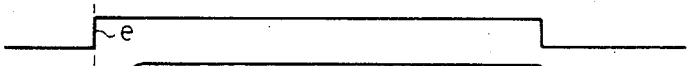
Figure 9D:
Figure 9E:
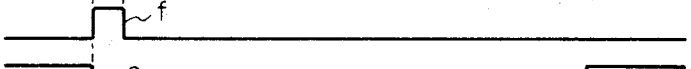
Figure 9F:
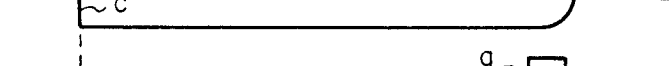
Figure 9G:
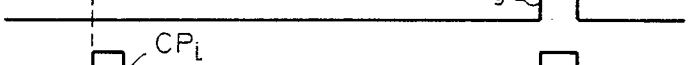
Figure 9H:

In FIG. 8, which is a detailed logic circuit diagram of one of the clock pulse generating circuits $PG_i$ of the pulse generating circuit PG of FIG. 7, references $G_1$ to $G_4$ are NAND gates, $G_5$ and $G_6$ NOR gates, $G_7$ an OR gate, and $C_1$ and $C_2$ capacitors. The operation will be explained below with reference to FIGS. 9A to 9H. When the address signal $A_i$ (node a) is changed from "1" to "0" as shown in FIG. 9A, the output b of the NAND gate $G_1$ changes as shown in FIG. 9B and the output d of the NAND gate $G_2$ is an inverted signal of the signal b which is delayed a little by the capacitor $C_1$, as shown in FIG. 9D. As a result, the output f of the NOR gate $G_5$ is a pulse which is generated by the rise of the address signal $A_i$, as shown in FIG. 9E. Similarly, in the circuit of the NAND gates $G_3$ and $G_4$, the capacitor $C_2$, and the NOR gate $G_6$, the output g of the NOR gate $G_6$ is a signal which is generated by the fall of the address signal $A_i$, as shown in FIG. 9G. Therefore, as shown in FIG. 9H the output $CP_i$ of the OR gate $G_7$, which combines the signal f with the signal g, is a clock signal which is generated by the change of the address signal $A_0, A_1, \ldots, A_{l-1}$, or the signal $\overline{CS}$.

Thus, since the bit line load currents are reduced, the power supply currents flowing through a defective memory cell can be reduced, even when the defective memory cell has a DC defect. Therefore, the DC defect can be substantially resolved.

Figure 10B:
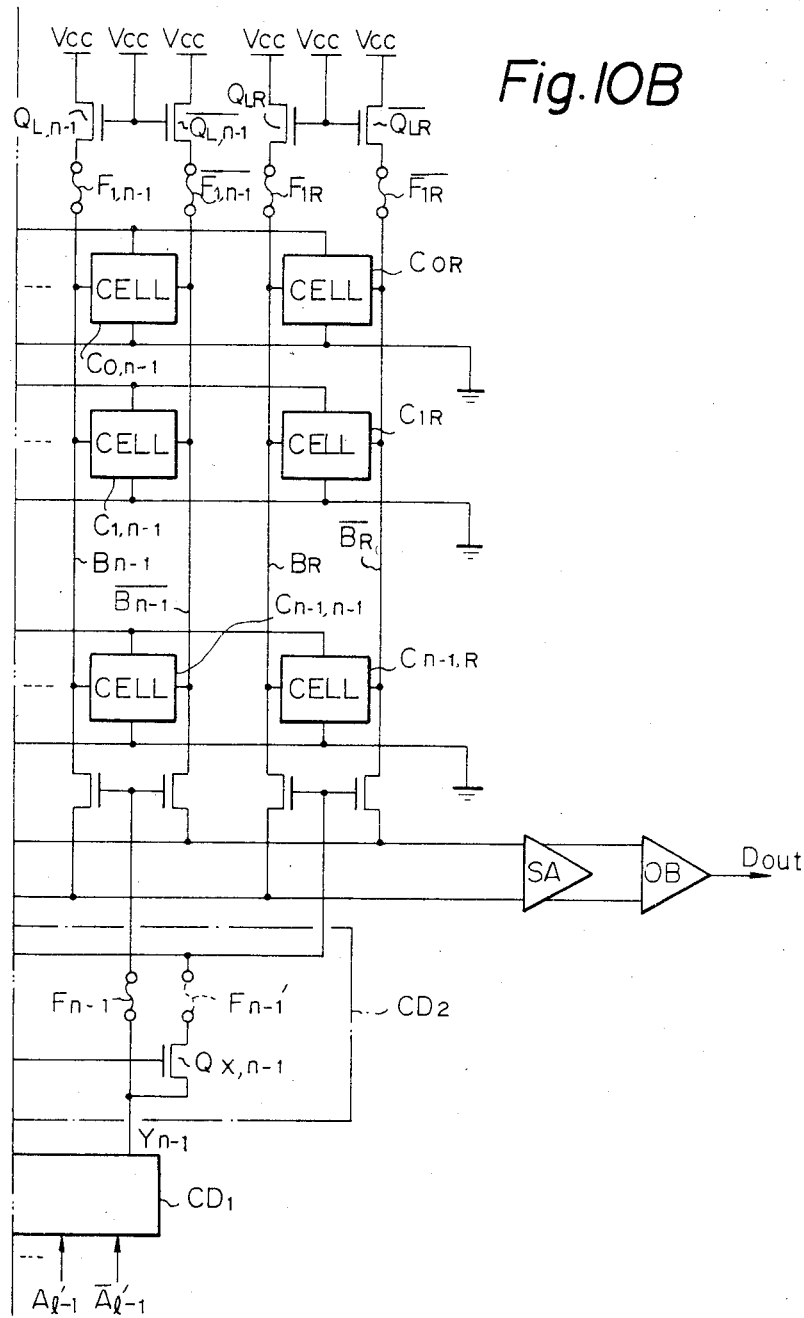

In FIGS. 10A and 10B, which together illustrate a second embodiment of the semiconductor memory device according to the present invention, fuses $F_{10}, \overline{F}_{10}, F_{11}, \overline{F}_{11}, \ldots, F_{1,n-1}, \overline{F}_{1,n-1}, F_{1R}$, and $\overline{F}_{1R}$, are added to the elements of FIG. 1. Each fuse is provided between the memory cells and the power supply $V_{CC}$. Note, each fuse can be provided on the drain side of the load transistor as well as on the source side thereof. In either case, the same effect is exhibited.

For example, when the memory cell $C_{00}$ is determined to be defective, in the decoder $CD_2$, the fuse $F_X$, $F_0, F_1', \ldots,$ and $F_{n-1}'$ are melted in the same way as stated above. In addition, the fuses $F_{10}$ and $\overline{F}_{10}$ are melted. Therefore, even when the memory cell $C_{00}$ has a DC defect, no current flows from the power supply $V_{CC}$ via the memory cell $C_{00}$ to the hold line $H_0$. This means that the DC defect is completely resolved.

Figure 11B:
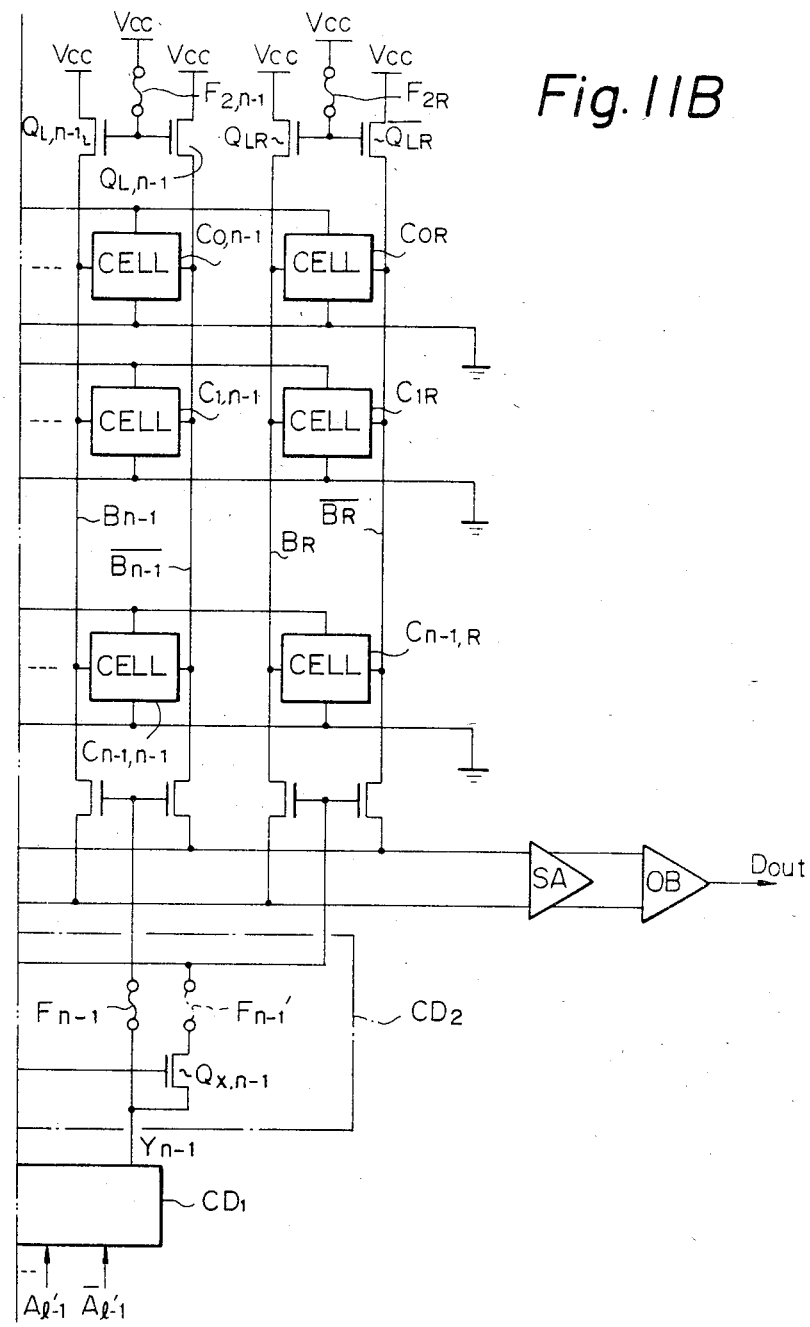

In FIGS. 11A and 11B, which together illustrate a third embodiment of the semiconductor memory device according to the present invention, fuses $F_{20}, F_{21}, \ldots, F_{2,n-1}$, and $F_{2R}$ are added to the elements of FIG. 1. This case is equivalent to that wherein each fuse is provided between the memory cells and the power supply $V_{CC}$.

For example, when the memory cell $C_{00}$ is determined to be defective, in the decoder $CD_2$, the fuses $F_X$, $F_0, F_1', \ldots,$ and $F_{n-1}'$ are melted in the same way as stated above. In addition, the fuse $F_{20}$ is melted, thereby obtaining the same state of FIGS. 10A and 10B.

Thus, since the power supply $V_{CC}$ can be disconnected from a defective memory cell, a DC defect within memory cells is itself resolved.

Note that while the above-mentioned embodiments relate to static metal-oxide semiconductor (MOS) memory devices, the invention can be applied in the same way to other memory devices, such as static bipolar transistor memory devices.

We claim:

1. A static semiconductor memory device comprising:
   a power supply means;
   a memory cell array having a plurality of normal memory cell rows or columns each comprising a plurality of memory cells;
   at least one redundancy memory cell row or column comprising a plurality of redundancy memory cells, said redundancy memory cell row or column being able to replace one of said normal cell rows or columns including a defective cell;
   a plurality of selecting line means, each connected to either one of said normal memory cell rows or columns, or said redundancy memory cell row or column; and
   a plurality of connecting/disconnecting means, each linked between one of said selecting line means and said power supply means, said connecting/disconnecting means electrically disconnecting said selecting line means from said power supply means for at least a non-selected mode of said device whereby current is prevented from flowing between said power supply means and said memory cells.

2. A device as set forth in claim 1, further comprising a plurality of additional selecting line means, connected to said memory cells and said redundancy memory cells, said additional selecting line means being perpendicular to said selecting line means.

3. A device as set forth in claim 2, wherein said connecting/disconnecting means electrically connects said selecting line means to said power supply means for a definite time period after said device is changed from a non-selected mode to a selected mode or after the potential of one of said additional selecting line means is changed.

4. A device as set forth in claim 1, wherein said connecting/disconnecting means comprises transistors linked between said selecting line means and said power supply means.

5. A device as set forth in claim 4, wherein each of said transistors comprises an enhancement MIS transistor having a drain connected to said power supply means, a source connected to one of said selecting line means, and a gate, the potential of said gate being controlled so as to turn on and off said MIS transistor.

6. A device as set forth in claim 4, wherein said connecting/disconnecting means further comprises:
   fuse means linked between said selecting line means and said transistors; and
   a melting means for melting said fuse means connectable to one of said selecting line means connected to one or more defective memory cells.

7. A device as set forth in claim 4, wherein said connecting/disconnecting means further comprises:
   fuse means linked between said power supply means and said transistors; and
   a melting means for melting said fuse means connectable to one of said selecting line means connected to one or more defective memory cells.

8. A static semiconductor memory device comprising:
   a power supply means;
   a memory cell array having a plurality of normal memory cell rows or columns each comprising a plurality of memory cells;
   at least one redundancy memory cell row or column comprising a plurality of redundancy memory cells, said redundancy memory cell row or column being able to replace one of said normal cell rows or columns including a defective cell;
   a plurality of selecting line means, each connected to either one of said normal memory cell rows or columns, or said redundancy memory cell row or column;
   a plurality of fuse means, each liked between one of said selecting line means and said power supply means; and
   a melting means for melting said fuse means connectable to one of said selecting line means connected to one or more defective memory cells to prevent flow of current between said power supply means and said memory cells.

9. A device as set forth in claim 8, further comprising:
   load transistors each having a drain connected to said power supply means, a source connected to one of said fuse means, and a gate connected to said power supply means.

10. A device as set forth in claim 8, further comprising:
    load transistors each having a drain connected to one of said fuse means, a source connected to one of said selecting line means, and a gate connected to said power supply means.

11. A device as set forth in claim 8, further comprising
    load transistors each having a drain connected to said power supply means, a source connected to one of said selecting line means, and a gate connected to one of said fuse means.

12. A device as set forth in claim 1, wherein each of said selecting line means comprises a pair of bit lines.

13. A device as set forth in claim 8, wherein each of said selecting line means comprises a pair of bit lines.

* * * * *